(12) United States Patent
Edwards et al.

(10) Patent No.: US 9,506,979 B2
(45) Date of Patent: Nov. 29, 2016

(54) TEST MODE ENTRY INTERLOCK

(71) Applicant: Freescale Semiconductor, Inc., Austin, TX (US)

(72) Inventors: William E. Edwards, Ann Arbor, MI (US); John M. Hall, Chelsea, MI (US)

(73) Assignee: Freescale Semiconductor, Inc., Austin, TX (US)

( * ) Notice: Subject to any disclaimer, the term of this patent is extended or adjusted under 35 U.S.C. 154(b) by 234 days.

(21) Appl. No.: 14/243,386

(22) Filed: Apr. 2, 2014

(65) Prior Publication Data

US 2015/0285858 A1    Oct. 8, 2015

(51) Int. Cl.
*G01R 31/26* (2014.01)
*G01R 31/317* (2006.01)
*H04L 1/00* (2006.01)
*G06F 1/00* (2006.01)

(52) U.S. Cl.
CPC ... *G01R 31/31713* (2013.01); *G01R 31/31701* (2013.01); *G06F 1/00* (2013.01); *H04L 1/00* (2013.01); *H04L 2201/00* (2013.01)

(58) Field of Classification Search
CPC ....... H04L 1/00; H04L 2201/00; G06F 1/00; G06F 2101/00; G11C 5/00; G11C 2207/00
See application file for complete search history.

(56) References Cited

U.S. PATENT DOCUMENTS

| | | | | |
|---|---|---|---|---|
| 5,068,850 A | * | 11/1991 | Moore | G08C 15/00 340/3.51 |
| 5,706,232 A | | 1/1998 | McClure et al. | |
| 5,991,910 A | * | 11/1999 | Hull | H03K 19/1732 326/16 |
| 6,233,173 B1 | * | 5/2001 | Chevallier | G11C 11/56 365/185.03 |
| 2003/0099137 A1 | * | 5/2003 | Martin | G11C 7/1051 365/198 |
| 2003/0128776 A1 | * | 7/2003 | Rawlins | H03G 3/20 375/319 |
| 2004/0141392 A1 | * | 7/2004 | Lee | G11C 7/1084 365/200 |
| 2006/0092728 A1 | | 5/2006 | Lim | |
| 2008/0195849 A1 | * | 8/2008 | Gonzalez | G06F 9/3009 712/223 |
| 2009/0033423 A1 | * | 2/2009 | Cho | H03F 3/301 330/264 |
| 2009/0168561 A1 | | 7/2009 | Park | |
| 2012/0242380 A1 | | 9/2012 | Edwards | |
| 2013/0218508 A1 | | 8/2013 | Jindal | |
| 2013/0238273 A1 | | 9/2013 | Tercariol et al. | |
| 2013/0328554 A1 | | 12/2013 | Pigott et al. | |

FOREIGN PATENT DOCUMENTS

EP    0768676 A2    4/1997
EP    0768676 A3    4/1997

* cited by examiner

*Primary Examiner* — Jermele M Hollington
*Assistant Examiner* — Temilade Rhodes-Vivour

(57) ABSTRACT

An integrated circuit having normal and special operating modes includes a mode entry interlock (201) which is enabled by an initialization command and an externally supplied voltage at a first I/O terminal (204) to detect a conflict at the I/O terminal for reducing the likelihood of inadvertent entry into the special operating mode. The mode entry interlock also includes a second I/O terminal (212) for receiving a disassociated software command to enter into the special operating mode, and mode control logic (210, 216) for evaluating the received software command against any detected conflict at the I/O terminal to generate a special operating mode enable signal in response to receiving the first and second input signals only when the detected logic state conflicts with the first logic state.

20 Claims, 3 Drawing Sheets

TEST MODE ENTRY INTERLOCK

BACKGROUND OF THE INVENTION

Field of the Invention

The present invention is directed in general to integrated circuit devices and methods for manufacturing and operating same. In one aspect, the present invention relates to the manufacture and use of semiconductor devices having a test mode operation.

Description of the Related Art

Testing of integrated circuit devices is a challenging task that requires significant cost, time, and equipment to test functionality and timing of circuits in each integrated circuit device. Integrated circuit devices often include a test mode to reduce overall test time and to test embedded functions not available at a package pin. To minimize or eliminate inadvertent entry into the test mode, test mode entry circuits typically require specified test mode entry actions, but such circuits can still be susceptible to noise or power-down and power-up sequences.

BRIEF DESCRIPTION OF THE DRAWINGS

The present invention may be understood, and its numerous objects, features and advantages obtained, when the following detailed description is considered in conjunction with the following drawings.

Figure 1:
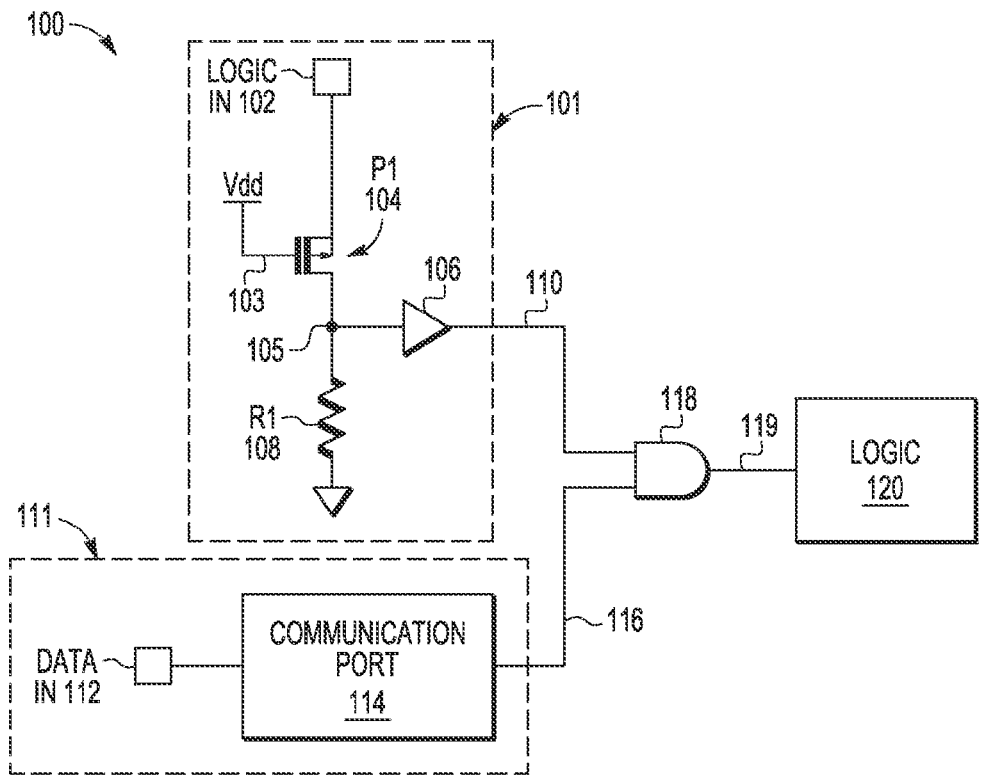
FIG. 1 shows a simplified circuit schematic diagram of a conventional test mode entry circuit.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A special mode entry interlock apparatus and associated method of operation provide an integrated circuit device with a normal operating mode and a special mode (e.g., test mode) by using a combined hardware and software scheme to control entry into the special mode only when disassociated and independent hardware and software events occur. In selected embodiments, the disclosed special mode entry interlock apparatus/method uses an existing output buffer to drive an associated I/O pin to a first logic state in response to a command while simultaneously externally forcing or over-driving the associated I/O pin to a second logic state by supplying an external voltage to create a conflict with the commanded I/O pin state, thereby creating a conflict detected by the input buffer connected to the IO pin to provide a first hardware entry gate requirement. In addition, the disclosed special mode entry interlock apparatus/method accepts or decodes a special mode command to enter the special mode. A logic block or discriminating circuit allows entry into the special mode only if the conflict at the associated I/O pin is detected when the special mode command is received, thereby providing a second software entry gate requirement for entering the special mode.

In other embodiments, two disassociated criteria are used to control entry into a test mode, namely (1) externally holding or driving an I/O logic pin high at the same time that an on-chip control command is issued to force the I/O logic pin low, and (2) receiving an "enter test mode" command. The first criteria may be initiated by a message, instruction, or other software command from a user, microcontroller, or other test entity. Upon receiving the message/instruction/command, the internal test control logic at the integrated circuit device may issue or execute a software command to enable an output buffer to try to force the associated I/O logic pin to a low voltage or logic state, while at the same time, the user/microcontroller/test entity drives the associated I/O logic pin to a high voltage or logic state. When the resulting conflict at the associated I/O logic pin is detected along with a separate message/instruction/command from the user/microcontroller/test entity to enter test mode, test control logic enables the integrated circuit device to enter the test mode.

Turning now to FIG. 1, there is shown a simplified circuit schematic diagram of a conventional test mode entry circuit 100 which includes a test signal generator 101 connected to a logic input pad 102, a test entry signal generator 111 connected to a data input pad 112, a combinatorial logic structure 118 connected to receive signal outputs 110, 116 from the test signal generator 101 and normal test entry signal generator 111, and a test logic circuit or block 120. The test signal generator 101 includes a PMOS transistor 104 that is source-drain coupled between the input pad 102 and an internal input node 105, an input buffer 106 that is connected to receive the internal input node 105 and generate a buffered output 110, and a first load resistor R1 108 that is connected between the internal input node 105 and ground. With the gate of the PMOS transistor 104 connected to a first reference voltage (e.g., Vdd), the application of a high driving voltage (e.g., above Vdd) to the logic input pad 102 causes the PMOS transistor 104 to turn "ON" and generate a first or "high" voltage at the internal input node 105 and buffer output 110 which corresponds to the first logic state. In this way, the test signal generator 101 generates a test signal (e.g., having a first or "high" logic state) at the output 110 of the buffer 106. If, simultaneously, the normal test entry signal generator 111 receives a message or other signal through the data input pad 112 to enter the test mode, control logic at the communication port 114 generates a normal test signal (e.g., having the first or "high" logic state) at the output 116. Upon detecting the first or "high" logic states on both the buffer output 110 and the communication port output 116, combinatorial logic structure 118 (e.g., AND gate) generates an output 119 which enables the logic 120 to enter into test mode. While conventional test mode entry circuit 100 provides acceptable performance, it requires the additional circuit components, such as the PMOS transistor 104, resistor 108, and detection (logic) buffer/comparator 106. In addition, there are costs associated with providing the additional components when these circuit elements are not used in the normal operation of the integrated circuit device.

Figure 2:
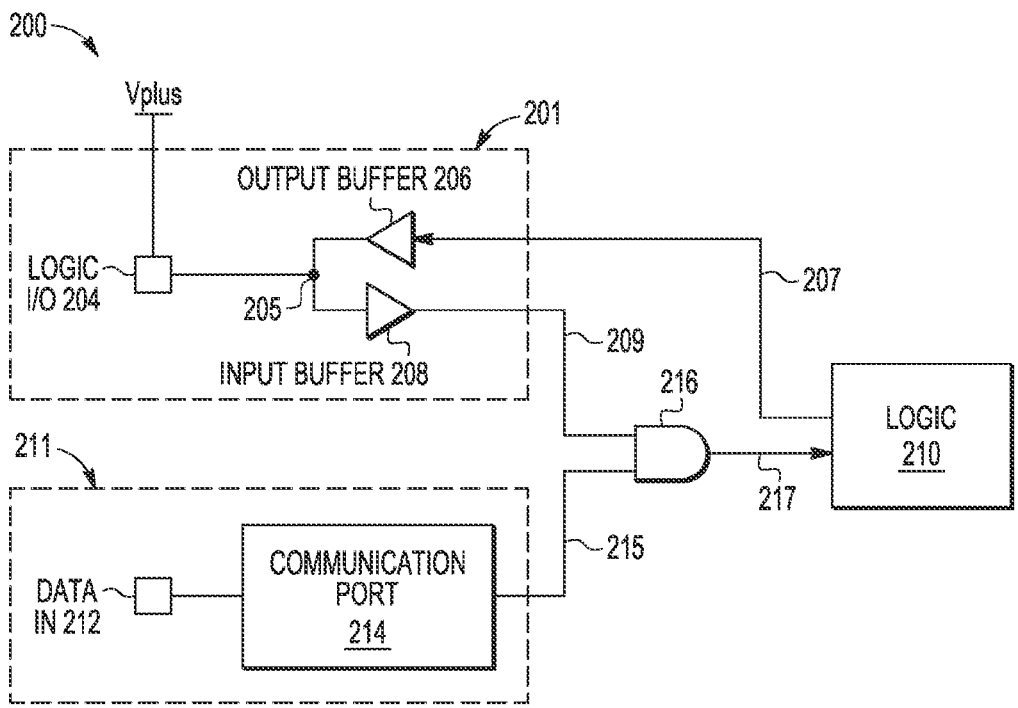
FIG. 2 shows a simplified circuit schematic diagram of a test mode entry interlock circuit in accordance with first selected embodiments of the present disclosure.

Turning now to FIG. 2, there is shown a simplified circuit schematic diagram of a test mode entry interlock circuit 200 in accordance with first selected embodiments of the present disclosure. The interlock circuit 200 addresses certain deficiencies and drawbacks associated with conventional approaches by eliminating the requirement of having additional test circuit components. As illustrated, the interlock circuit 200 includes a hardware-enabled test signal generator 201, which implements a hardware entry gate requirement to provide a first test mode entry condition. Connected to an existing logic input/output pad 204, the hardware-enabled test signal generator 201 uses an existing output buffer 206 to force the I/O pad 204 to a first or "low" logic state/voltage while simultaneously forcing the I/O pad 204 to a second or "high" logic state/voltage with an externally supplied voltage, thereby generating a conflict at the I/O pad 204 which is detected by input buffer 208. To provide a second, independent test mode entry condition, the interlock circuit 200 also includes a test entry signal generator 211 having a communication port 214 connected to receive test mode entry commands at a data input pad 212. The interlock circuit 200 also includes a combinatorial logic structure 216 which is connected to receive signal outputs 209, 215 from the hardware-enabled test signal generator 201 and test entry signal generator 211, and to generate an output 217 which enables the test control logic 210 to enter into test mode.

The hardware-enabled test signal generator 201 includes a logic I/O pad 204 and an input/output buffer 206, 208 that are connected together at a shared node 205 connected as the output of the output buffer 206 and as the input of the input buffer 208. In selected embodiments, the logic I/O pad 204 and input/output buffer 206, 208 are used in the normal operation of the integrated circuit device, as opposed to being part of separate, dedicated test circuits. At the logic I/O pad 204, an external voltage (e.g., Vplus) may be applied as part of the test mode entry sequence to force the logic I/O pad 204 to a predetermined voltage (e.g., Vdd). And with the input buffer 208 connected between the shared node 205 and a buffered input signal line 209 to the combinatorial logic structure 216, any (externally supplied) voltage or logic signal at the logic I/O pad 204 is conveyed to the combinatorial logic structure 216 for input, detection, or other processing. In the reverse direction, the connection of the output buffer 206 between the test control logic 210 and the shared node 205 enables the test control logic 210 to issue a command 207 to the output buffer 206 to force the logic I/O pad 204 to a second or "low" voltage. Based on the state of the internal node 205, the test control logic 210 may include control logic that is configured to detect a conflict between the command 207 (which attempts to force the logic I/O pad 204 to a second or "low" voltage) and any detected first or "high" voltage at the shared node 205 that is induced at the logic I/O pad 204 by application of external voltage (Vplus).

While FIG. 2 shows that the shared node 205 is supplied to the combinatorial logic structure 216, it will be appreciated that the shared node 205 may be supplied directly to the test control logic 210 (not shown) for detection and processing. In any case, the hardware-enabled test signal generator 201 generates a buffered output test signal 209 having first or "high" logic state at the output of the buffer 208 in response to an externally applied voltage (e.g., Vplus) which can be used by the test control logic 210 to detect a conflict at the I/O pad 204. Such a conflict can be detected with test control logic 210 which detects that the combinatorial logic structure output 217 has a first logic state (e.g., a "high" voltage) and that the command 207 to the output buffer 206 has a second logic state (e.g., a "low" voltage).

If a test mode command (e.g., software command, such as an SPI command) on the data input pad 212 is received at the test entry signal generator 211, control logic at the communication port 214 forwards the test mode command over signal line 215 to the combinatorial logic structure 216, such as a logical AND gate structure. In turn, the combinatorial logic structure 216 logically combines the test mode command 215 and the buffered input signal line 209 indication that the I/O pad 204 is in a first logic state (e.g., "high" voltage), thereby generating an output 217 which enables the logic 210 to detect a conflict at the hardware entry gate 205, 206, 208 and enter into the test mode. Though not shown, it will be appreciated that the test mode command may be supplied directly to the test control logic 210 for detection and processing.

As seen from the foregoing, an integrated circuit device which is operating in a normal operation mode may use the test mode entry interlock circuit 200 to control entry into a special test mode and to prevent inadvertent entry into the special test mode. The special test mode is enabled by a providing a hardware event and a disassociated software event. Initiated with a software command or instruction from the user or tester to enable an existing output buffer (e.g., output buffer 206) for a first terminal to be forced to a logic 0 voltage level (e.g., 0V), the hardware event is enabled by supplying an external voltage (e.g., Vplus) at the first terminal (e.g., logic I/O pin 204). The disassociated software event is the receipt and processing of an independent software command or message from the user or tester to enter the special test mode. The circuit for enabling entry into the special test mode includes an I/O buffer (e.g., 206, 208) connected to the first terminal (e.g., logic I/O pin 204), including an input buffer (e.g., 208) for conveying the logic state of the first terminal to test control logic (e.g., 210) and an output buffer (e.g., 206) which may be used to output a logic state to the first terminal. The input buffer (e.g., 208) may be implemented with any desired logic circuitry so that, when clocked upon detection of a voltage (e.g., Vplus) at the first terminal 204, the input buffer generates a buffered output test signal 209 having a first or "high" logic state which can be used by the test control logic 210 to detect a conflict at the I/O pad 204. Similarly, the output buffer (e.g., 206) may be implemented with any desired logic circuitry so that, when clocked upon detection of a received command 207, the output buffer drives the first terminal 204 to a second or "low" logic state. To control test mode entry, logic is disclosed for evaluating the disassociated hardware and software events which accepts the independent software command or message to enter the special test mode only if a conflict is detected between the logic states of the command 207 and the buffered output test signal 209.

Figure 3:
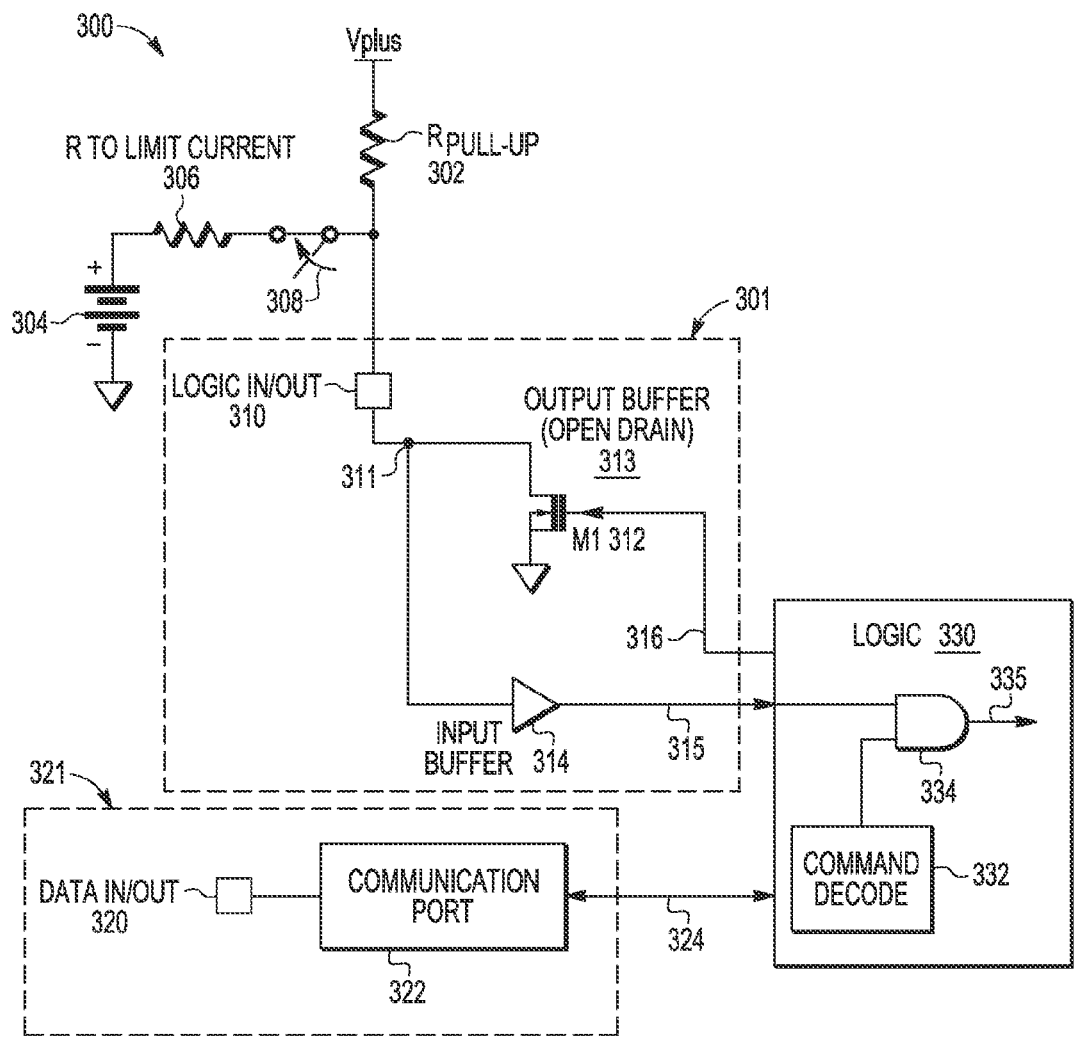
FIG. 3 shows a simplified circuit schematic diagram of a test mode entry interlock circuit in accordance with second selected embodiments of the present disclosure.

Turning now to FIG. 3, there is shown a simplified circuit schematic diagram of a test mode entry interlock circuit 300 in accordance with second selected embodiments of the present disclosure. Interlock circuit 300 includes a hardware-enabled test signal generator 301 which implements a hardware entry gate requirement to provide a first test mode entry condition. As illustrated, the hardware-enabled test signal generator 301 includes an existing logic input/output pad 310 which is connected at a shared internal node 311 to the output of an output buffer 313 that drives the logic I/O pad 310. In selected embodiments, the shared internal node is connected to the drain of an NMOS transistor 312 in the output buffer 313 which conveys an output signal command 316 from the test control logic 330. Though not shown, the shared internal node may instead be connected to the output buffer 313 implemented as an NPN transistor configured as an open collector output stage which conveys an output signal command 316 from the test control logic 330. In the hardware-enabled test signal generator 301, the shared internal node 311 is also connected to the input of an input buffer 314 for conveying the logic state of shared internal node 311 at signal line 315 to a test control logic block 330. With the input buffer 314 connected between the shared internal node 311 and a buffered input signal line 315 to the test control logic 330, any (externally supplied) voltage or logic signal at the logic I/O pad 310 is conveyed to the test control logic 330 for input, detection, or other processing. In selected embodiments, the logic I/O pad 310 and input/output buffer 312-314 are used in the normal operation of the integrated circuit device, as opposed to being part of separate, dedicated test circuits.

In order to over-drive the logic I/O pin 310 to a first logic state (or "high" voltage), the interlock circuit 300 may also include pull-up circuitry 302, 304, 306, 308, either as an externally provided circuit or as part of the hardware-enabled test signal generator 301. For example, an external voltage (e.g., Vplus) may be applied across a pull-up resistor $R_{PULL-UP}$ 302 to force the logic I/O pad 310 to a predetermined overdrive voltage Vdd). To achieve the desired overdrive at the shared internal node 311, an additional power source 304 may also be connected in series with a current limiting load resistor 306 and switch 308 to force the logic I/O pad 310 and shared internal nod 311 to the predetermined overdrive voltage (e.g., Vdd). With this overdrive or pull-up circuitry, the logic I/O pad 310 may be externally forced to the first logic state (or "high" voltage) which overdrives the NMOS transistor 312 in the output buffer 313 (e.g., Vds on M1≈5V), even when the output buffer 313 receives a signal line command 316 from the test control logic 330 to force the logic I/O pad 310 to a second logic state (or "low" voltage). In this way, the hardware-enabled test signal generator 301 implements a hardware entry gate requirement to provide a first test mode entry condition when a conflict is detected at the test control logic 330 between the logic states on the signal lines 315, 316.

At the NMOS transistor 312, the interaction between the external voltage (which is applied to the transistor drain) and the signal line command 316 (which is applied to the transistor gate) is as follows. When the signal command 316 (e.g., a "high" voltage) is received at the transistor gate, the NMOS transistor 312 is turned "ON" (e.g., M1Vgs≈5V, Vds=0V), thereby pulling the voltage on the logic I/O pin 310 down to a first logic state (e.g., ground or 0V). However, when the user/tester externally forces the logic I/O pin to the drive voltage, a "high" voltage having a second logic state is supplied to the drain of the NMOS transistor (e.g., M1 Vds≈5V), thereby overdriving the output buffer. To achieve overdrive and raise the voltage at the logic I/O pin, the NMOS transistor 312 sinks current while maintaining the "high" voltage at the logic I/O pin having the second logic state.

The disclosed interlock circuit 300 also includes a software-enabled test signal generator 321 which implements a software entry gate requirement to provide a second test mode entry condition. To provide the second, independent test mode entry condition, the software-enabled test signal generator 321 may include a data input/output pad or terminal 320 and a communication port 322 that are connected to receive and process test mode entry commands at the data I/O pad 320. If a test mode command (e.g., software command, such as an SPI command) is received on the data I/O pad 320 of the test signal generator 321, control logic at the communication port 322 forwards the test mode command over signal line 324 to the test control logic 330. At the test control logic 330, the received test mode command is decoded at the command decode block 332, and then logically combined with the buffered input signal line 315 indication that the I/O pad 310 is in a first logic state (e.g., "high" voltage) at the combinatorial logic structure 334 to generate an output 335. The test control logic 330 may then evaluate the output signal 334 and the signal line command 316 indication that the logic I/O pad 310 is being forced to a conflicting second logic state (or "low" voltage), thereby accepting the test mode command to enter the test mode only if a conflict is detected at the logic I/O pin 310.

As will be appreciated, the test control logic 330 may include control logic that is configured to detect a conflict between a detected first logic state at the shared node 311 (that is induced at the logic I/O pad 310 by application of external voltage) and the command 316 (which attempts to force the logic I/O pad 310 to a second or "low" voltage). For example, an example detection methodology is depicted with the following test mode entry routine or algorithm:

Step 1 (Initialize Output Buffer At I/O Pin): In response to initialization command from a user/test entity, send output buffer command with first logic state to I/O pin by turning "ON" NMOS transistor to connect I/O terminal to ground (e.g., M1 Vgs≈5V, Vds≈0V).

Step 2 (Detect Voltage Vplus At I/O Pin): In response to external voltage at I/O pin (e.g., M1 Vds≈5V), detect second logic state at I/O pin through input buffer.

Step 3 (Receive Test Mode Entry Command): Detect software test mode entry command from user/test entity.

Step 4 (Conditional Test Mode Entry Through Logical AND Of Software Test Mode Entry Command And I/O Pin State): IF detected second logic state at I/O pin conflicts with first logic state sent in output buffer command, ACCEPT software test mode entry command. ELSE, Ignore software test mode entry command.

As will be appreciated, the foregoing routine can be expressed in hardware and/or software, such as by using combinatorial logic gates and state machines or by using pseudo-code form and/or translated into corresponding assembly-language or high-level-language code or control logic circuitry as desired. In addition, the software-related operations described herein can include directly entered commands by a computer system user and/or steps executed by software modules. The functionality of any step referred to herein may correspond to the functionality of modules or portions of modules. In addition to software modules, the above flows or portions of flows can be implemented as application instructions. The operations referred to herein may be modules or portions of modules (e.g., software, firmware, or hardware modules). For example, the software modules discussed herein may include script, batch or other executable files, or combinations and/or portions of such flies. The software modules may include a computer program or subroutines thereof encoded on computer-readable media.

Figure 4:
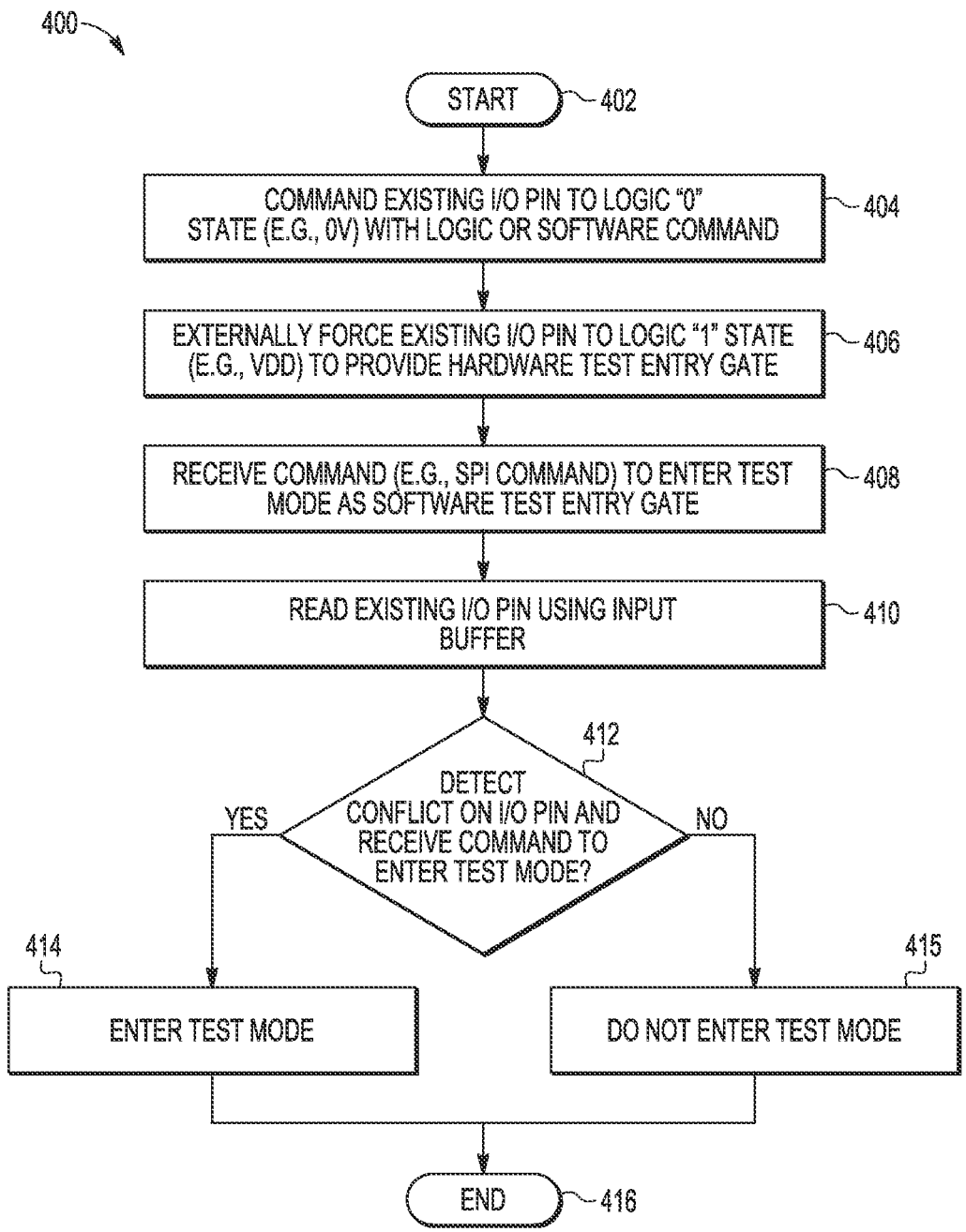
FIG. 4 is a simplified process flow chart illustrating various methods for entering a test mode of an integrated circuit device in accordance with selected embodiments of the invention.

To further illustrate selected embodiments of the present disclosure, reference is now made to FIG. 4 which shows a simplified process flow chart illustrating various methods 400 for entering a test mode of an integrated circuit device. The methodology may be used during fabrication or in the field to control entry of the integrated circuit device into a test mode of operation. Thus, while the operation of the test mode entry interlock methodology may be used relative to a special test mode of operation after an integrated circuit device is in a normal operating mode, it will be appreciated that the methodology may be used in other contexts as well.

In describing the operational methodology 400, it will be appreciated that the specific sequence and ordering of steps may be changed or altered, including the insertion of one or more additional steps and/or the omission of one or more steps, as indicated by the context and requirements of the application.

Once the test mode entry sequence starts (step 402), a command is issued to drive an I/O pin to a first logic state (e.g., logic "0" or 0V) using control logic which responds to a software command from the user or tester (step 404). This operation may be performed when the user or test entity issues a message, instruction or other software command via a microcontroller or similar control functionality. Upon receipt, the test control may execute the message/instruction/command to initialize the test mode entry interlock sequence by enabling an output buffer to drive an associated I/O pad to the first logic state. In selected embodiments, the I/O pad is part of the circuitry used by the integrated circuit device during normal operating mode.

At step 406, the I/O pad is externally forced to a second logic state (e.g., logic "1" or Vdd), thereby providing a first hardware entry gate. This operation may be performed by using pull-up circuitry to supply one or more voltage signals (e.g., Vplus) to the I/O pad, forcing it to the second logic state. In the event of a voltage at the I/O pad, the voltage at the I/O pad rises to the second logic state, notwithstanding the effort by the output buffer to drive the I/O pad to the first logic state.

At step 408, a software test entry command or other communication (e.g., an SPI command) is received which conveys an instruction to enter the test triode, thereby providing a second software entry gate. Provided as an independent and disassociated event, the software test entry command cannot be used by the customer to inadvertently enter the test mode because of the hardware test entry gate function provided by the externally supplied voltage drive requirement. As will be appreciated, the software test entry may occur earlier or later or parallel to the sequence of the operational methodology 400.

At step 410, the logic state at the I/O pad is read by test control logic selected embodiments, the read operation uses an input buffer to convey the logic state to test control logic, such as by generating a signal line indication that the input buffer sees the second first logic state at the I/O pad.

The protective requirement is implemented at step 412 by detecting if there is a conflict on the I/O pad at the same time a software test entry command is received. As described herein, a conflict on the I/O pad arises when the I/O pad has a second logic state (e.g., a "high" voltage) at the same time that the output buffer for the I/O pad is being driven to the first logic state (e.g., a "low" voltage), or vice versa. If both of the disassociated events occur (affirmative outcome to decision 412) so that there is a detected conflict on the I/O pad when the software test entry command is received, then the software test entry command is accepted and the integrated circuit device enters the test mode at step 414. However, if both of the disassociated events do not occur together (negative outcome to decision 412), then the software test entry command is not accepted and the integrated circuit device.

By now it should be appreciated that there is provided herein an integrated circuit device having normal and special operating modes. The integrated circuit device includes a first terminal for receiving an externally supplied voltage, and a second terminal circuit for receiving a special mode entry command that is independent from the externally supplied voltage and for generating a second input signal. In selected embodiments, the first terminal, input/output buffer, and second terminal circuit are used by the integrated circuit device during normal operating mode. In addition, an input/output buffer is coupled to the first terminal, including an output buffer connected to drive the first terminal to a first logic state in response to a first logic state input provided to the output buffer, and an input buffer connected to convey a detected logic state from the first terminal as a first input signal. In selected embodiments, an external voltage source may be connected to the first terminal to force the first terminal to a second, different logic state. In selected embodiments, the output buffer is an NPN transistor configured as an open collector output stage or is an NMOS transistor that is source-drain coupled between the first terminal and a predetermined reference voltage and that is gated by the first logic state input. In such embodiments, the NMOS transistor may be sized so that the output buffer is unable to drive the first terminal to the first logic state when then externally supplied voltage is supplied to the first terminal. In addition, the NMOS transistor may be sized to not overheat or suffer electrical over-stress. In other embodiments, the input and output buffers are configured and connected to be conflicting buffers for the first terminal. The integrated circuit device also includes an evaluation circuit for generating a special mode enable signal in response to receiving the first and second input signals only when the detected logic state conflicts with the first logic state at the time the special mode entry command is received. In selected embodiments, the evaluation circuit includes a combinatorial logic structure (e.g., logical AND gate) for logically combining the first and second input signals into a special mode enable signal. In other embodiments, the evaluation circuit is configured to continually provide the first logic state input to the output buffer to drive the first terminal to the first logic state in response to a software command.

In another form, there is provided a method of operation for generating a test entry signal. In the disclosed methodology, an input/output (I/O) pin of an integrated circuit is driven to a first logic state while simultaneously forcing the I/O pin to a second, different logic state, thereby creating a conflict condition at the I/O pin. In selected embodiments, the I/O pin drive may be implemented by connecting an output buffer to drive the I/O pin to the first logic state while simultaneously forcing the I/O pin to a second, different logic state, thereby creating a conflict condition at the I/O pin; and connecting an input buffer to buffer the I/O pin to convey a detected logic state from the I/O pin as a first input signal which is processed by test mode control logic to detect the conflict condition at the I/O pin. To force the I/O pin to the second, different logic state, the I/O pin may be connected to an external voltage source. In other embodiments, an existing I/O pin of the integrated circuit is driven to the first logic state with a first output buffer while simultaneously forcing the existing I/O pin to a second, different logic state with an externally supplied voltage, thereby creating the conflict condition at the existing I/O pin. In selected embodiments, a second input buffer may be used to drive a signal input line to test mode control logic, where the second input buffer is connected to receive the existing I/O pin, thereby enabling the test mode control logic to detect the conflict condition at the existing I/O pin. In such embodiments, a first received message, instruction, or other software command from a user, microcontroller, or other test entity causes the test mode control logic to drive the existing I/O pin of the integrated circuit to the first logic state. In the disclosed methodology, a test mode entry command is received at a terminal circuit of the integrated circuit, such as by receiving a second, different message, instruction, or other software command from a user, microcontroller, or other test entity. As a result, a test entry signal is generated by accepting the test mode entry command only if the conflict condition at the I/O pin is detected within a specified detection window after receiving the test mode entry command. In selected embodiments, the test entry signal may be generated by logically combining first and second input signals into an enter test mode command, where the first input signal is generated in response to receiving the test mode entry command, and where the second input signal is generated in response to the I/O pin being forced to the second, different logic state.

In yet another form, there is provided a special mode entry interlock circuit and associated method for operating an integrated circuit device. As disclosed, the integrated circuit device includes input/output pads, where the I/O pads include a first input/output pad for receiving an externally supplied voltage during a special operating mode. An output buffer is connected to drive the first input/output pad to a first logic state in response to a first logic state input provided to the output buffer. In addition, a conflicting input buffer is connected to buffer a detected logic state from the first input/output pad as a first input signal. In addition, a communication port circuit is connected to receive a special mode entry command that is independent from the externally supplied voltage and for generating a second input signal. Finally, special mode control logic is provided for logically combining the first and second input signals to generate a special mode enable signal only when the detected logic state conflicts with the first logic state. In selected embodiments of the special mode entry interlock circuit, the plurality of input/output pads, output buffer, conflicting input buffer, and communication port are used by the integrated circuit device during normal operating mode Various illustrative embodiments of the present invention have been described in detail with reference to the accompanying figures. While various details are set forth in the foregoing description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are shown in simplified schematic diagram form, rather than in detail, in order to avoid limiting or obscuring the present invention. Such descriptions and representations are used by those skilled in the art to describe and convey the substance of their work to others skilled in the art. Although the described exemplary embodiments disclosed herein are directed to methods and systems for controlling entry into a test mode, the present invention is not necessarily limited to the example embodiments illustrate herein, and various embodiments of a test mode entry interlock circuit and methodology disclosed herein may be implemented with other circuit components. For example, the logic states, voltage levels, and device types (e.g., NMOS or PMOS transistors) can be reversed. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An integrated circuit device, comprising:
a first terminal for receiving an externally supplied voltage to force the first terminal to a first logic state;
an input/output buffer coupled to the first terminal, comprising:
an output buffer connected to drive the first terminal to a second logic state in response to a command input provided to the output buffer, and
an input buffer connected to convey a detected logic state from the first terminal as a first input signal in response to the externally supplied voltage being received at the first terminal;
a second terminal circuit for receiving a special mode entry command that is independent from the externally supplied voltage and for generating a second input signal; and
an evaluation circuit for generating a special mode enable signal in response to receiving the first and second input signals only when the detected logic state conflicts with the second logic state.

2. The integrated circuit device of claim 1, where the first terminal, input/output buffer, and second terminal circuit are used by the integrated circuit device during normal operating mode.

3. The integrated circuit device of claim 1, where the output buffer comprises an NMOS transistor that is source-drain coupled between the first terminal and a predetermined reference voltage and that is gated by the command input.

4. The integrated circuit device of claim 3, where the NMOS transistor is sized so that the output buffer is unable to drive the first terminal to the second logic state when then externally supplied voltage is supplied to the first terminal.

5. The integrated circuit device of claim 3, where the NMOS transistor is sized to not overheat or suffer electrical over-stress.

6. The integrated circuit device of claim 1, where the output buffer comprises an NPN transistor configured as an open collector output stage.

7. The integrated circuit device of claim 1, where the evaluation circuit comprises a combinatorial logic structure for logically combining the first and second input signals to generate the special mode enable signal.

8. The integrated circuit device of claim 1, where the evaluation circuit generates the special mode enable signal only when the detected logic state conflicts with the second logic state at the time the special mode entry command is received.

9. The integrated circuit device of claim 1, where the output buffer and input buffer are configured to be conflicting buffers for the first terminal.

10. The integrated circuit device of claim 1, where the evaluation circuit is configured to continually provide the command input to the output buffer to drive the first terminal to the second logic state in response to a software command.

11. A method of operation, comprising:
  driving an input/output (I/O) pin of an integrated circuit to a first logic state while simultaneously forcing the I/O pin to a second, different logic state, thereby creating a conflict condition at the I/O pin;
  receiving a test mode entry command at a terminal circuit of the integrated circuit; and
  generating a test entry signal by accepting the test mode entry command only if the conflict condition at the I/O pin is detected within a specified detection window after receiving the test mode entry command.

12. The method of claim 11, where driving the I/O pin comprises driving a first I/O pin of the integrated circuit that is used during normal operation to the first logic state with a first output buffer while simultaneously forcing the first I/O pin to a second, different logic state with an externally supplied voltage, thereby creating the conflict condition at the first I/O pin.

13. The method of claim 12, further comprising driving a signal input line to test mode control logic with a second input buffer connected to receive the first I/O pin, thereby enabling the test mode control logic to detect the conflict condition at the first I/O pin.

14. The method of claim 13, further comprising receiving a first message, instruction, or other software command from a user, microcontroller, or other test entity which causes the test mode control logic to drive the first I/O pin of the integrated circuit to the first logic state.

15. The method of claim 14, where receiving the test mode entry command comprises receiving a second message, instruction, or other software command from a user, microcontroller, or other test entity.

16. The method of claim 11, where receiving the test mode entry command comprises receiving a second message, instruction, or other software command from a user, microcontroller, or other test entity.

17. The method of claim 11, where driving the I/O pin comprises connecting an overdrive voltage source to the I/O pin to force the I/O pin to the second, different logic state.

18. The method of claim 11, where generating the test entry signal comprises logically combining first and second input signals into an enter test mode command, where the first input signal is generated in response to receiving the test mode entry command, and where the second input signal is generated in response to the I/O pin being forced to the second, different logic state.

19. The method of claim 11, where driving the I/O pin comprises:
  connecting an output buffer to drive the I/O pin to the first logic state while simultaneously forcing the I/O pin to a second, different logic state, thereby creating a conflict condition at the I/O pin; and
  connecting an input buffer to buffer the I/O pin to convey a detected logic state from the I/O pin as a first input signal which is processed by test mode control logic to detect the conflict condition at the I/O pin.

20. A special mode entry interlock circuit for an integrated circuit device, comprising:
  a plurality of input/output pads, comprising a first input/output pad for receiving an externally supplied voltage during a special operating mode;
  an output buffer connected to drive the first input/output pad to a first logic state in response to a first logic state input provided to the output buffer;
  a conflicting input buffer connected to buffer a detected logic state from the first input/output pad as a first input signal;
  a communication port circuit for receiving a special mode entry command that is independent from the externally supplied voltage and for generating a second input signal; and
  special mode control logic for logically combining the first and second input signals to generate a special mode enable signal only when the detected logic state conflicts with the first logic state,
  where the plurality of input/output pads, output buffer, conflicting input buffer, and communication port are used by the integrated circuit device during normal operating mode.

* * * * *